(12) United States Patent
Jeon et al.

(10) Patent No.: US 7,345,945 B2
(45) Date of Patent: Mar. 18, 2008

(54) LINE DRIVER CIRCUIT FOR A SEMICONDUCTOR MEMORY DEVICE

(75) Inventors: Byung-Gil Jeon, Suwon-si (KR); Byung-Jun Min, Yongin-si (KR); Kang-Woon Lee, Seoul (KR); Han-Joo Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/232,170

(22) Filed: Sep. 21, 2005

(65) Prior Publication Data

US 2006/0092750 A1    May 4, 2006

(30) Foreign Application Priority Data

Oct. 28, 2004    (KR) ............... 10-2004-0086504

(51) Int. Cl.
*G11C 8/00* (2006.01)
(52) U.S. Cl. ............... 365/230.06; 365/230.07; 365/149; 365/185.23
(58) Field of Classification Search ........... 365/230.06, 365/230.07, 149, 185.23, 285.23
See application file for complete search history.

(56) References Cited

U.S. PATENT DOCUMENTS

| | | | | |
|---|---|---|---|---|
| 5,654,930 A | * | 8/1997 | Yoo et al. | 365/222 |
| 5,761,148 A | * | 6/1998 | Allan et al. | 365/230.06 |
| 5,867,445 A | | 2/1999 | Kirsch et al. | 365/230.06 |
| 5,896,344 A | | 4/1999 | Kirsch et al. | 365/230.06 |
| 5,910,927 A | * | 6/1999 | Hamamoto et al. | 365/230.03 |
| 5,943,289 A | * | 8/1999 | Ahn et al. | 365/230.06 |
| 5,986,966 A | * | 11/1999 | Nagata | 365/230.06 |
| 6,188,599 B1 | * | 2/2001 | Kang | 365/145 |
| 6,442,078 B1 | * | 8/2002 | Arimoto | 365/189.08 |
| 6,452,862 B1 | * | 9/2002 | Tomotani | 365/230.06 |
| 6,954,398 B2 | * | 10/2005 | Ninomiya et al. | 365/230.06 |
| 2005/0035411 A1 | * | 2/2005 | Hasegawa et al. | 257/369 |

* cited by examiner

*Primary Examiner*—Connie C. Yoha
(74) *Attorney, Agent, or Firm*—F. Chau & Assoc., LLC

(57) ABSTRACT

A semiconductor memory device having a word line driver circuit configured in stages. A plurality of sub word line driver circuits are connected, in parallel, to each main word line, and provide a sub word line enable signal to a selected sub word line in response to a main word line enable signal provided through a main word line. A plurality of (local) word line driver circuits are connected in parallel, to each sub word line and provide a local word line enable signal to a selected local word line in response to the (main/sub) word line enable signal so as to operate a plurality of memory cells connected to the selected local word line. The transistor count and layout area of a semiconductor memory device decreases and a reduced chip area can be achieved.

20 Claims, 7 Drawing Sheets

LINE DRIVER CIRCUIT FOR A SEMICONDUCTOR MEMORY DEVICE

BACKGROUND OF THE INVENTION

1. Field of the Invention

The present invention relates to a semiconductor memory device having a word line driver circuit, and more particularly to a word line driver circuit and a plate line driver circuit having stages and a reduced chip area.

2. Description of the Related Art

A semiconductor memory device operating at a low voltage generally employs a voltage boosting circuit to apply a voltage higher than the nominal supply voltage so as to increase the operating speed and the reliability of reading or writing data in a memory cell. In this manner, a voltage corresponding to data applied to a bit line is transferred to a capacitor of a memory cell without a drop of threshold voltage in an access transistor of a memory cell, or data (charge) stored in the capacitor is passed to the bit line without a drop of threshold voltage of the access transistor, to prevent or substantially reduce errors in read or write operations.

In such a semiconductor memory device a word line driver circuit constructed of a boosting circuit is generally used to apply a voltage level higher than the power supply voltage VDD, to a word line.

FIG. 1 is a circuit diagram illustrating a conventional word line driver circuit for use in a ferroelectric random access memory (FRAM).

Referring to FIG. 1, a conventional word line driver circuit includes four transistors N1, N2, N3 and N4, and has three control signals (lines) SWL_PDb, SWL_PD and SWL_DRV in addition to a main word line MWL and outputs a voltage to a sub word line SWL.

The word line driver circuit is configured so that a main word line enable signal (an output signal of word line decoding circuit, not shown) on the main word line MWL is transferred (passed) to a gate of a transistor N1 through a pass transistor N2, thus turning ON the transistor N1. The transistor N1 is configured to transfer (pass) the control signal SWL_DRV (that has a level of an external power supply voltage VPP having a level higher than the power supply voltage VDD), to a sub word line SWL connected to (access transistors of) a plurality of memory cells. The sub word line SWL is connected to a discharge transistor N4 that is controlled by control signal SWL_PDb, to prevent floating of the sub word line.

All control signals shown in FIG. 1 except the control signal SWL_PDb are maintained at a ground voltage level (Vss, 0V), before the main word line enable signal is applied. When a read or write operation starts, a main word line enable signal is applied (at a power supply voltage level VDD) to a selected main word line MWL. Then, a node voltage (on the node between the transistor N2 and the transistor N1) at the gate of transistor N1, increases to a voltage level VDD−Vth obtained by subtracting the threshold voltage Vth of the transistor N2 from the power supply voltage level VDD. After a while, when a control signal SWL_DRV is applied at an external power supply voltage level VPP, the node voltage is boosted to VCC−Vth+VPP by a capacitance between the drain and the gate of the transistor N1. Hence, the transistor N1 has the sufficient gate voltage VCC−Vth+VPP, and a voltage level VPP (of the control signal SWL_DRV at the external power supply voltage level VPP) is supplied to a sub word line SWL without a drop of threshold voltage of the transistor N1. Thus an access transistor of a memory cell (CELL) connected to the sub word line SWL operates by a sub word line enable signal at the external power supply voltage level VPP, without error.

The control signal SWL_PD is applied to drive the transistor N3 at a voltage having the power supply voltage level VDD, to prevent floating of a sub word line of a word line driver circuit that is not selected among the plurality of word line driver circuits.

FIG. 2 is a block diagram illustrating the layout of a semiconductor memory device having the conventional word line driver circuit of FIG. 1.

With reference to FIG. 2, a plurality of conventional word line driver circuits SWD 10 are connected, in parallel, to a main word line MWL, and each word line driver circuit 10 is connected to every memory CELL in a memory cell array 20 by one sub word line SWL (e.g., SWL0).

In a semiconductor memory device having such a conventional word line driver circuit, the number of memory cells to be controlled by one word line driver circuit SWD 10 on an integrated chip may be limited by the parasitic capacitance of each sub word line. Each unit of length of sub word line has an associated parasitic capacitance and also each of the memory cells connected to the sub word line adds a gate capacitance to the parasitic capacitance of the sub word line. Thus, for driving a large number of memory cells on a chip, a large number of word line driver circuits are required, and the number of memory cells that can be controlled by each word line driver circuit is limited.

As previously noted, the conventional word line driver circuit shown in FIG. 1 is constructed of four transistors (switches) and so in using a large number of word line driver circuits, significant layout area is required on the chip, causing an increase of chip size.

FIG. 3 illustrates a conventional word line driver and plate line driver circuit SWPD 40 for use in a ferroelectric random access memory (FRAM).

As shown in FIG. 3, the word line driver and plate line driver circuit SWPD 40 is configured as one unit, including a conventional plate line driver circuit 30 and the conventional word line driver circuit 10 of FIG. 1.

In the conventional plate line driver circuit 30, when a main word line enable signal is applied (by MWL), a voltage boosting operation of transistor N6 and transistor N5 occurs as in the word line driver circuit 10 (of FIG. 1). Then, a control signal SPL_DRV is supplied, at a power supply voltage level VDD, as a plate line enable signal to a plate line SPL without a drop of the threshold voltage of the transistor N5, to operate (read or write) a memory cell.

The transistor N7 prevents floating of the plate line SPL when a main word line disable signal is applied on the main word line (MWL).

FIG. 4 is a block diagram illustrating the layout of a FRAM having a plurality of the conventional word line driver and plate line driver circuits SWPD 40 of FIG. 3.

Referring to FIG. 4, a plurality of conventional word line driver and plate line driver circuits SWPD 40 are connected, in parallel to each other, to a main word line MWL, and each word line driver and plate line driver circuit SWPD 40 is connected to a memory cell array through a sub word line (SWL0) and a plate line (SPL0).

The word line driver and plate line driver circuit SWPD 40 drives ferroelectric memory cells. The number of memory cells connectable to one word line SWL and plate line SPL is limited. Therefore, in a highly-integrated semiconductor memory device, several word line driver and plate line driver circuits 40 are needed, which occupies significant layout area, causing an increase of chip size.

SUMMARY OF THE INVENTION

An exemplary embodiment of the invention provides a semiconductor memory device, having a reduced layout area and chip size.

According to one aspect of the invention, a ferroelectric or semiconductor memory device includes a circuit controlling memory cells in a cell array. The circuit comprises: a plurality (m) of sub word line driver circuits that are connected, (in parallel to each other), to a main word line and that are adapted to provide a sub word line enable signal (passed from the logical combination of signals on the main word line and a sub word line control signal line) to a selected one of m sub word lines in response to a main word line enable signal asserted on the main word line; a plurality (m×n) of local word line driver circuits, n of which are connected in parallel to each of the m sub word lines and that are adapted to provide a local word line enable signal to a selected one of m×n local word lines, in response to the sub word line enable signal so as to operate a plurality (l) of memory cells connected to the selected local word line.

Each sub word line driver circuit and a corresponding plate line driver circuit may be configured in one unit, and the sub word line driver circuit may include a P-type switch (e.g., PFET transistor) that is driven by the main word line enable signal (and that passes a sub word line enable signal to a selected sub word line); a first N-type switch (e.g., NFET transistor) to prevent floating of sub word line when a main word line disable signal is applied; and a second N-type switch (e.g., NFET transistor) (also driven by the main word line) to prevent floating of sub word line not selected when the main word line enable signal is applied.

Further, the plate line driver circuit may include a P-type switch (e.g., PFET transistor) that is driven by the main word line (enable signal) and that provides a plate line enable signal to the plate line; and an N-type switch (e.g., NFET transistor) that is also driven by the main word line (disable signal) (to prevent floating of the plate line).

According to another aspect of the invention, a semiconductor memory device includes a circuit for controlling memory cells in a cell array. The circuit comprises: a plurality (n) of sub word line driver circuits, each of which is connected to a main word line and is adapted to provide a sub word line enable signal to a sub word line in response to a main word line enable signal (provided through the main word line); and a plurality (n×m) of local word line driver circuits, m of which are connected to each of the n sub word lines, and each of which is adapted to provide a local word line enable signal to a selected local word line in response to the sub word line enable signal so as to operate at least one (e.g., a plurality) memory cell(s) connected to the selected local word line. Preferably, the symbols m, n and l denote integer numbers and x denotes multiplication thereof (e.g., for example, if m=1024, and n=8; then m×n=8192).

The sub word line driver circuit may include a P-type switch (e.g., PFET transistor) that is driven by the main word line (enable signal), to provide a sub word line enable signal to a selected sub word line; a first N-type switch (e.g., NFET transistor) to prevent floating of sub word line not selected when a main word line disable signal is applied; and a second N-type switch (e.g., NFET transistor) to prevent floating of the sub word line not selected when the main word line enable signal is applied.

An embodiment of the local word line driver circuit may include a first N-type switch (e.g., NFET transistor), which is connected between the sub word line and the local word line, (to provide the sub word line enable signal as a local word line enable signal to the selected local word line); and a second N-type switch (e.g., NFET transistor) (to prevent floating of a non-selected local word line). Embodiments of the local word line driver circuit may further include a third N-type switch (e.g., NFET transistor) driven by a control signal for providing a voltage boost to the first N-type switch of the local word line driver circuit. In which case, the first N-type switch (e.g., NFET transistor) of the local word line driver circuit is connected between the sub word line and the local word line, to provide a local word line enable signal having the same voltage level as the sub word line enable signal, to a selected local word line, through a voltage boost with the third N-type switch (e.g., NFET transistor) of the local word line driver circuit.

In some embodiments of the local word line driver circuit, an N-type switch (e.g., NFET transistor) may be connected between the local word line and a ground voltage to prevent floating of the non-selected local word line(s).

Another embodiment of the local word line driver circuit may include a P-type switch (e.g., PFET transistor), that is connected between the sub word line and the local word line and driven by a control signal line, (to provide the sub word line enable signal as the local word line enable signal to a selected local word line); an N-channel transistor connected between the local word line and a ground voltage and driven by the same control signal line, (to prevent a floating of non-selected local word line). This embodiment of the local word line driver circuit may further include either: an N-type switch (e.g., NFET transistor) driven by the main word line (disable signal), (to prevent floating of a non-selected local word line); or an N-type switch (e.g., NFET transistor) connected between the sub word line and the local word line, to complement the local word line enable signal (to prevent floating of a non-selected local word line).

According to exemplary embodiments of the invention, semiconductor memory devices appropriate for high density integration can be obtained.

BRIEF DESCRIPTION OF THE DRAWINGS

Exemplary embodiments of the present invention are more fully described below with reference to FIGS. 5 to 12. Exemplary embodiments of the invention are described with reference to the accompanying drawings, in which.

DETAILED DESCRIPTION OF EXEMPLARY EMBODIMENTS OF THE INVENTION

Figure 5:
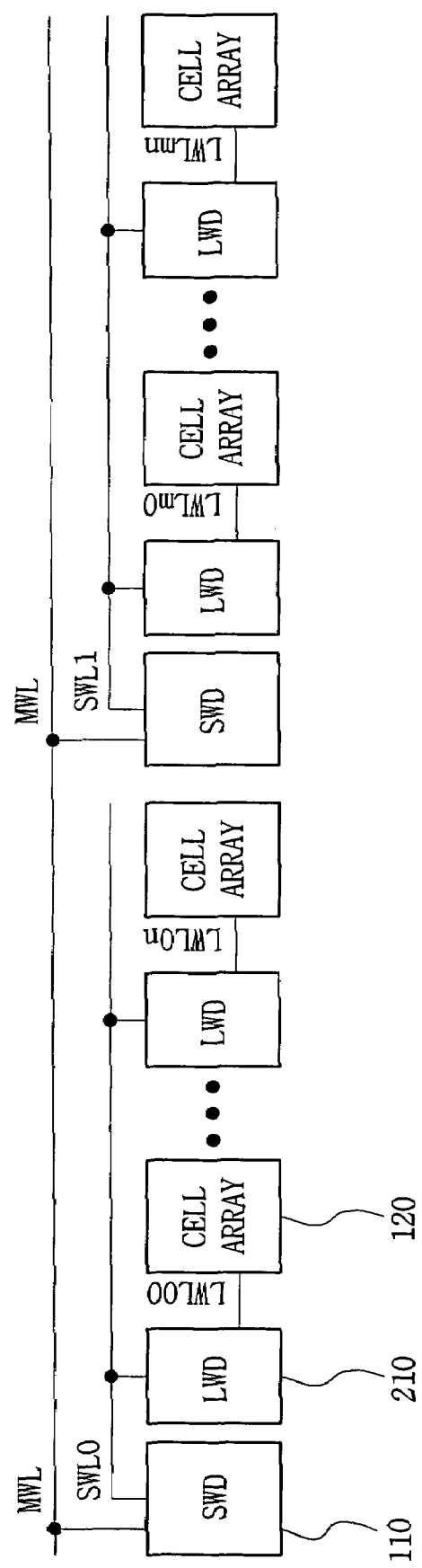
FIG. 5 is a block diagram illustrating the layout of semiconductor memory device having (staged) word line driver circuits according to an exemplary embodiment of the invention.
Figure 11:
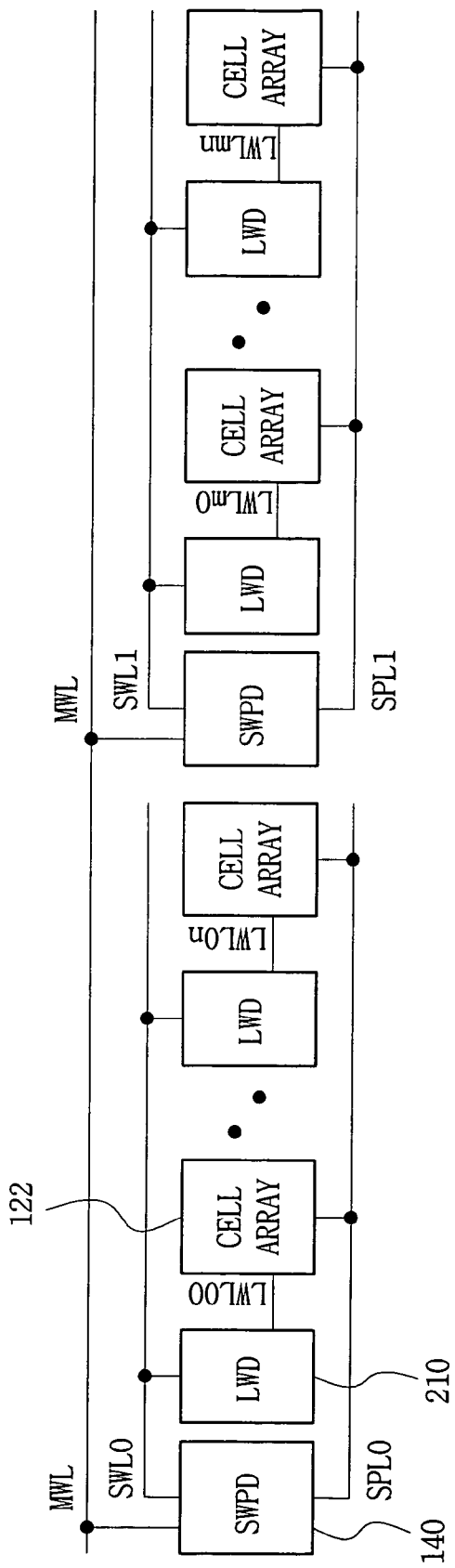
FIG. 11 is a block diagram illustrating the layout of a FRAM having a word line driver and plate line driver circuit according to an exemplary embodiment of the invention.

FIGS. 5 and 11 illustrate a representative part of the layout of a semiconductor memory device according to an embodiment of the invention. In the following description a sub word line will be represented by reference symbol 'SWL', a sub word line driver circuit by reference symbol 'SWD', a local word line by reference symbol 'LWL', and a local word line driver circuit by reference symbol 'LWD'.

FIG. 5 is a block diagram illustrating the layout of word line driver circuits in a semiconductor memory device according to an exemplary embodiment of the invention.

Referring to FIG. 5, a word line driver circuit in a semiconductor memory device according to an exemplary embodiment has a three-stage structure: of a main word line MWL controlled by a word line decoder circuit (not shown); sub word lines SWL controlled by sub word line driver circuits; and local word lines LWL controlled by local word line driver circuits LWD.

For example, in FIG. 5 there is shown one main word line MWL; two sub word lines SWL0 and SWL1 individually controlled by two sub word line driver circuits SWD 110 that are connected to the main word line MWL; and local word line driver circuits LWD, 210 that are connected to each of the sub word lines SWL0 and SWL1, to control respective local word lines LWL00, LWL0n, LWLm0 and LWLmn. The overall layout of such semiconductor memory device can be understood by those skilled in the art as including a plurality (n×m) of local word lines controlled by a plurality (m) of sub word lines, all controlled by one main word line MWL.

The word line decoder circuit (not shown) may be constructed of a conventional word line decoder circuit that is known to those skilled in the art. The word line decoder circuit generates a main word line enable signal (on a selected main word line MWL) in response to an applied row address signal.

One or more sub word line driver circuits SWD 110 are connected, in parallel, to the main word line MWL.

The sub word line driver circuit 110, to which a main word line enable signal is input, provides a sub word line enable signal to a selected sub word line SWL0 in response to a main word line enable signal from the main word line MWL.

One or more local word line driver circuits LWD are respectively connected with the respective sub word lines SWL.

The local word line driver circuit 210, to which a sub word line enable signal is inputted, provides a local word line enable signal to a selected local word line LWL00 in response to the sub word line enable signal from the sub word line driver circuit 110.

The local word lines LWL are each connected to a plurality of memory cells in a cell array. One local word line LWL can be connected to the same number of memory cells connected to a conventional word line driver circuit based on the prior art.

When a local word line enable signal is provided to the selected local word line LWL00, an access transistor of at least one (and preferably all) memory cell connected to the local word line LWL00 is turned on.

In a semiconductor memory device having such layout described above, a sub word line SWL may be constructed of a metal line etc., to minimize parasitic resistance. Only the junction capacitance of non-selected local word line(s) LWD and a line capacitance of a sub word line SWL are added to the parasitic capacitance. Hence, the invention can be realized without a speed difference as compared with the prior art, even though a plurality of (shorter) local word lines LWD are used instead of one (longer) sub word line SWL.

Figure 6:
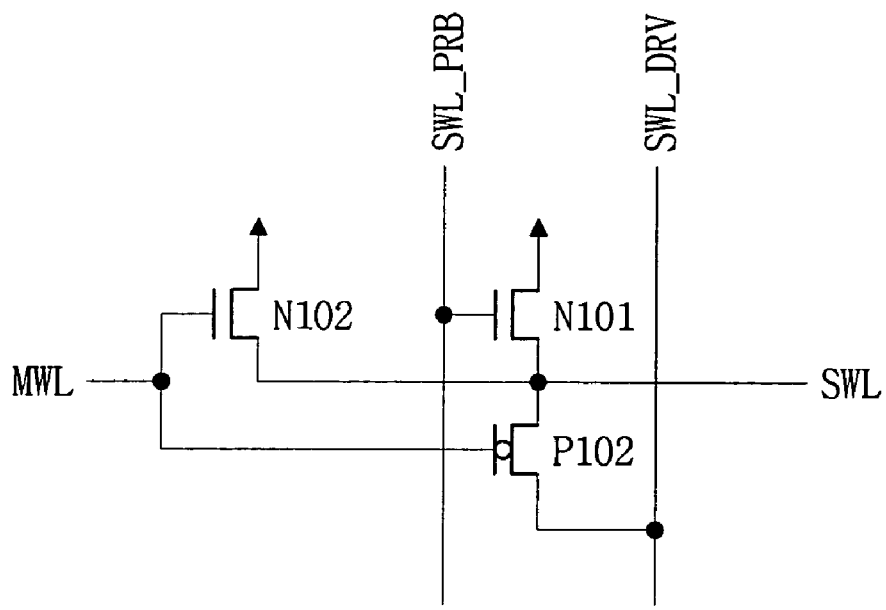
FIG. 6 is a circuit diagram illustrating an example of a sub word line driver circuit in the semiconductor memory device of FIG. 5.

FIG. 6 is a circuit diagram illustrating an example of a sub word line driver circuit in the semiconductor memory device of FIG. 5.

As shown in FIG. 6, a sub word line driver circuit 110 includes one P-type switch (e.g., P-channel transistor) P102, a first N-type switch (e.g., N-channel transistor) N102, a second N-type switch (e.g., N-channel transistor) N101 and lines to which control signals SWL_PRB and SWL_DRV are applied. A P-type switch (e.g., a P-FET) is ON (conducting across its channel) when a logic High voltage level is applied to its gate. A N-type switch is ON (conducting across its channel) when a logic Low voltage level is applied to its gate.

The gate of the P-type switch (F-FET transistor) P102, is connected to a main word line MWL, and the P-type switch (P-FET transistor) P102 is connected between a line to which a control signal SWL_DRV is applied, and a sub word line SWL. The P-type switch (P-FET transistor) P102 is driven by a main word line enable signal applied through the main word line MWL to provide a sub word line enable signal to a sub word line SWL.

The gate of the first N-type switch (e.g., NFET transistor) N102 is connected to the main word line MWL, and the first N-type switch (e.g., NFET transistor) N102 is connected between a ground voltage (Vss, 0V) and the sub word line SWL. The first N-type switch (e.g., NFET transistor) N102 is to prevent floating of the (non-selected) sub word line SWL when a main word line disable signal is applied.

The gate of the second N-type switch (e.g., NFET transistor) N101 is connected to a line transmitting control signal SWL_PRB and is driven thereby. The second N-type switch (e.g., NFET transistor) N101 is connected between a ground (Vss, 0V) and the sub word line SWL. The second N-type switch (e.g., NFET transistor) N101 is to prevent floating of sub word line SWL not selected when the main word line enable signal is applied.

In the sub word line driver circuit 110 of FIG. 6, the main word line enable signal has a ground voltage (Vss 0V), contrary to the conventional case, and the main word line disable signal has a first voltage level VPP that has a voltage level higher (by a predetermined amount) than the second (power supply) voltage level VDD. In the prior art, the first voltage level VPP described above has been as an external power supply voltage level.

The operation of the sub word line driver circuit 110 of FIG. 6 will be described as follows.

First, when a main word line disable signal is applied, (i.e., a sub word line driver circuit SWD is not selected), the non-selected sub word line SWL is maintained at a ground voltage (Vss, 0V) (by the first N-type switch (e.g., NFET transistor) N102 driven by the main word line disable signal), to prevent floating.

Next, when a main word line enable signal is applied, all sub word line driver circuits connected to main word line MWL to which the main word enable signal is applied are driven; meanwhile, one sub word line SWL is selected by control signals SWL_PRB and SWL_DRV.

When the main word line enable signal is applied through the main word line MWL, the P-type switch (e.g., PFET transistor) P102 transfers the control signal SWL_DRV (having a first voltage level VPP), as a sub word line enable signal, to the sub word line SWL. By using a P-type switch (e.g., PFET transistor) P102 to transfer the control signal SWL_DRV to the sub word line SWL, there is no threshold voltage drop effect. Thus, the sub word line enable signal is transmitted through P102 at the first voltage level VPP and a boosting circuit is unnecessary. Further, the invention can have an effect of reducing one transistor, as compared with the prior art.

Even though the main word line enable signal is applied through the main word line MWL, when a voltage level of the control signal SWL_DRV is maintained at a ground voltage (Vss, 0V) and a control signal SWL_PRB has a first voltage level VPP or a second voltage level VDD; a sub word line enable signal is not generated. In other words, the sub word line enable signal is applied only to a sub word line SWL selected by the main word line enable signal and the control signals SWL_PRB and SWL_DRV. In this case, to prevent floating of non-selected sub word line SWL, the second N-type switch (e.g., NFET transistor) N101 operates.

FIGS. 7 to 10 are circuit diagrams that each illustrate an exemplary implementation of the local word line driver circuit LWD 210 in the semiconductor memory device of FIG. 5. It may be beneficial to connect local word line driver circuits shown in FIGS. 7 to 10 with sub word line driver circuit shown in FIG. 6, but it may be also be valid to use the conventional word line driver circuit as the sub word line driver circuit in the structure of FIG. 5.

Figure 7:
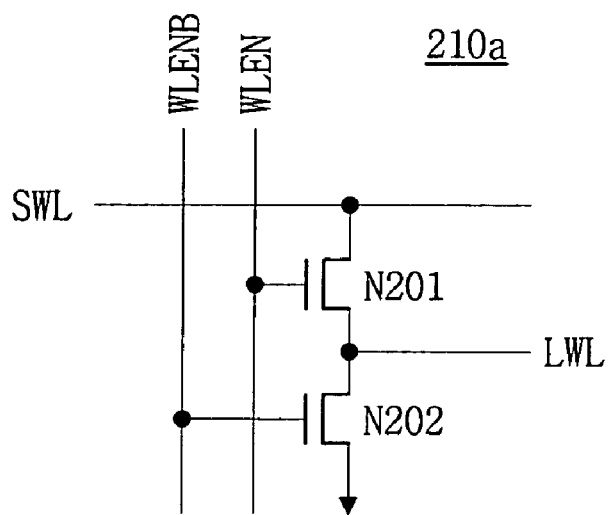
FIGS. 7 to 10 are each circuit diagrams illustrating different examples of a local word line driver circuit for use in the semiconductor memory device of FIG. 5.

FIG. 7 is a circuit diagram illustrating, an example of the local word line driver circuit LWD 201 for use in FIG. 5. Local word line driver circuit 210a is constructed of two N-type switches (e.g., NFET transistors) N201 and N202, and has a line to which a first control signal WLEN is applied, and a line to which a second control signal WLENB is applied.

The N-type switch (e.g., NFET transistor) N201 is driven by first control signal WLEN applied to its gate, and is connected between a sub word line SWL and a local word line LWL. The N-type switch (e.g., NFET transistor) N201 passes the sub word line enable signal as a local word line enable signal to the selected local word line LWL when the first control signal WLEN applied to its gate is active (Low).

The N-type switch (e.g., NFET transistor) N202 is driven by second control signal WLENB applied to its gate, and is connected between the local word line LWL and a ground voltage (Vss, 0V). The N-type switch (e.g., NFET transistor) N202 is to prevent floating of non-selected local word line.

The first control signal WLEN normally maintains a ground voltage (Vss, 0V), and has an (active) voltage level higher by a determined voltage level than the first voltage level VPP when selecting the local word line LWL. For example, in selecting a local word line LWL, the (active) voltage level of the first control signal WLEN may have a level VPP+Vth obtained by adding up a first voltage level VPP to a threshold voltage level Vth of the N-type switch (e.g., NFET transistor) N201.

The second control signal WLENB normally has a second voltage level VDD or a first voltage level VPP, and is transited to a ground voltage (Vss, 0V) level when selecting the local word line LWL.

The operation of the local word line driver circuit 210a shown in FIG. 7 is described as follows.

The local word line LWL is maintained at a ground voltage (Vss, 0V) by an N-type switch (e.g., NFET transistor) N202 operated by the second control signal WLENB, before a sub word line enable signal is applied. Then, the sub word line SWL is selected and a sub word line enable signal is applied through the sub word line SWL, and the first control signal WLEN connected to a selected local word line driver circuit is transited to a voltage level higher by a determined level (e.g., by Vth) than a first voltage level VPP, from a ground voltage (Vss, 0V). The sub word line enable signal is transferred to the local word line LWL through the N-type switch (e.g., NFET transistor) N201 driven by the first control signal WLEN, and becomes a local word line enable signal. Since the (active).voltage level of the first control signal WLEN is higher by a determined level (e.g., by Vth) than the first voltage level VPP, the local word line enable signal maintains the first voltage level VPP.

Meanwhile, the first control signal WLEN of a non-selected local word line driver circuit has a ground voltage (Vss, 0V) level, and a second control signal WLENB has a first voltage level VPP or a second voltage level VDD. Thus, N-type switch (e.g., NFET transistor) N202 is driven to prevent floating of non-selected local word line(s). When a sub word line SWL is not selected (a sub word line enable signal is not applied) and when the first control signal WLEN has a voltage level higher by a determined level (e.g., by Vth) than a first voltage level VPP and the second control signal WLENB has a ground voltage (Vss, 0V), then floating of the local word line LWL is also prevented through the N-type switch (e.g., NFET transistor) N201.

Figure 8:
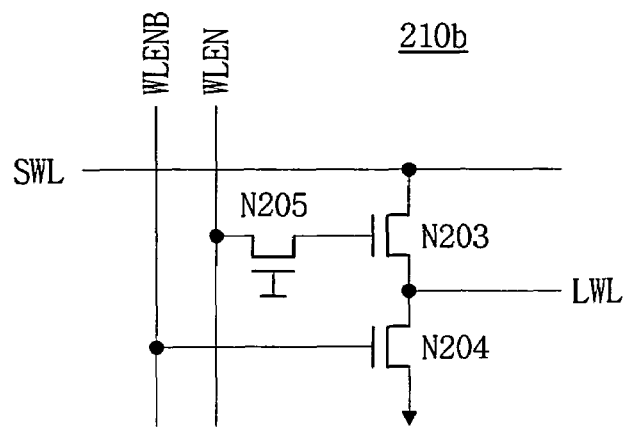

FIG. 8 is a circuit diagram illustrating another example of a local word line driver circuit 210 for use in FIG. 5. Local word line driver circuit 210b is constructed of three N-type switches (e.g., NFET transistors) N203, N204 and N205, and has a line to which a first control signal WLEN is applied, and a line to which a second control signal WLENB is applied.

The N-type switch (e.g., NFET transistor) N205 is connected between the line to which a first control signal WLEN is applied, and a gate of the N-type switch (e.g., NFET transistor) N203, and is driven by a control signal of the second voltage level VDD.

The N-type switch (e.g., NFET transistor) N203 is connected between the sub word line SWL and a local word line LWL, and provides a local word line enable signal (having the same voltage level as the sub word line enable signal), to a selected local word line LWL, (by a boost with the N-type switch (e.g., NFET transistor) N205).

The N-type switch (e.g., NFET transistor) N204 is connected between the local word line LWL and a ground (Vss, 0V) line, for preventing floating of a non-selected local word line, and is driven by a second control signal WLENB.

The first control signal WLEN normally is maintained at a ground voltage (Vss, 0V) level, and is transited to first voltage level VPP for selecting the local word line LWL.

The second control signal WLENB normally has a second voltage level VDD or a first voltage level VPP, and is transited to a ground voltage (Vss, 0V) level when selecting the local word line LWL.

The operation of the local word line driver circuit 210b shown in FIG. 8 is described as follows.

Before a sub word line enable signal is applied, the local word line LWL is maintained at a ground voltage (Vss, 0V) level by N-type switch (e.g., NFET transistor) N204 operated by the second control signal WLENB. Then, when the sub word line SWL is selected, the first control signal WLEN is transited from a ground voltage (Vss, 0V) level to a first voltage level VPP, and a sub word line enable signal is applied through the sub word line SWL. Thus, like in the conventional word line driver, a gate node of the N-type switch (e.g., NFET transistor) N203 is boosted to transfer the sub word line enable signal as a local word line enable signal of first voltage level VPP without a voltage drop (by Vth) across NFET transistor) N203.

Meanwhile, the first control signal WLEN of non-selected local word line driver circuit(s) has a ground voltage (Vss, 0V), and a second control signal WLENB has a first voltage level VPP or a second voltage level VDD. Thus, N-type switch (e.g., NFET transistor) N204 of non-selected local word line(s) LWL is driven to prevent floating of the non-selected local word line(s) LWL. When a sub word line SWL is not selected (a sub word line enable signal is not applied) and when the first control signal WLEN has first voltage level VPP and the second control signal WLENB has a ground voltage (Vss, 0V) level, floating of the local word line LWL is also prevented through the N-type switch (e.g., NFET transistor) N203.

Figure 9:
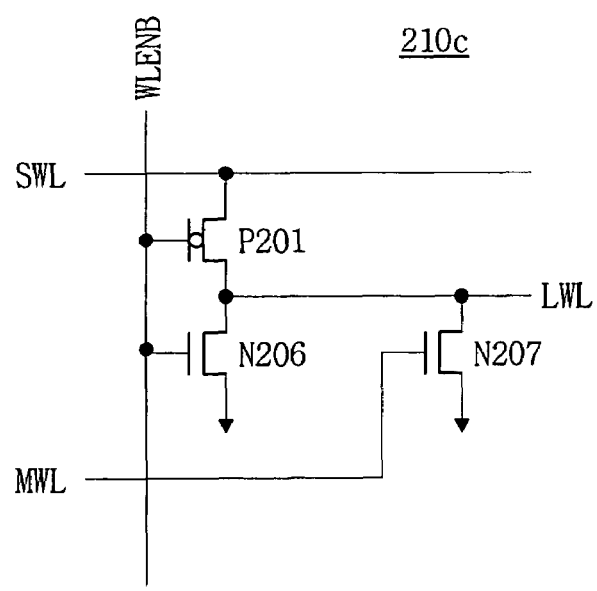

FIG. 9 is a circuit diagram illustrating another examples of a local word line driver circuit 210 for use in FIG. 5. Local word line driver circuit 210c is constructed of two N-channel transistors N206 and N207, one P-type switch (e.g., PFET transistor) P201 and has a line to which a control signal WLENB is applied.

The P-type switch (e.g., PFET transistor) P201 is connected between a sub word line SWL and a local word line LWL, and is driven by the control signal that has a ground voltage (Vss, 0V) level when a sub word line enable signal is applied, and transmits the sub word line enable signal as the local word line enable signal to a selected local word line LWL.

The N-type switch (e.g., NFET transistor) N206 is connected between the local word line LWL and a ground voltage (Vss, 0V) line, and is driven by the control signal WLENB to prevent floating of non-selected local word line(s) LWL.

The N-type switch (e.g., NFET transistor) N207 is connected between the local word line LWL and the ground voltage (Vss, 0V) line, and is driven by the main word line disable signal to prevent floating of the local word line.

The control signal WLENB is applied as a sub word line enable signal, and has a ground voltage (Vss, 0V) for selecting the local word line LWL, but has first voltage level VPP when the local word line LWL is not selected.

The operation of the local word line driver circuit 210c shown in FIG. 9 is described as follows.

Before a sub word line enable signal is applied, the local word line LWL is maintained at a ground voltage (Vss, 0V) by the N-type switch (e.g., NFET transistor) N206 operated by the control signal WLENB. Then, when the sub word line SWL is selected, the sub word line enable signal is applied through the sub word line SWL. The sub word line enable signal is applied, and simultaneously, the control signal WLENB is transited to a ground voltage (Vss, 0V) level to operate (close) the P-type switch (e.g., PFET transistor) P201 so that the sub word line enable signal is transferred to a selected local word line LWL without a voltage drop, and thus the sub word line enable signal becomes the local word line enable signal.

Meanwhile in the case of non-selected local word lines LWL, when a sub word line enable signal is applied, the control signal WLENB has a first voltage level VPP in the local word line driver circuit connected to the non-selected local word line(s) LWL, and the N-type switch (e.g., NFET transistor) N206 is driven (closed) to prevent floating of non-selected local word line(s) LWL. When the sub word line enable signal is not applied, floating of the local word line LWL is prevented through the N-type switch (e.g., NFET transistor) N207.

Figure 10:
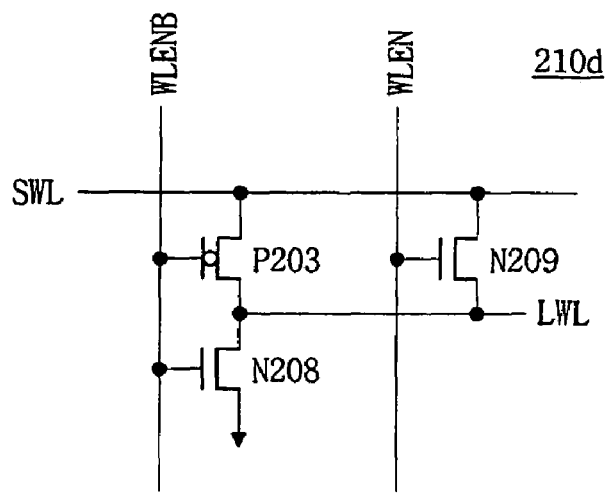

FIG. 10 is a circuit diagram illustrating another example of a local word line driver circuit 210 of FIG. 5. Local word line driver circuit 210d is constructed of two N-channel transistors N208 and N209, one P-type switch (e.g., PFET transistor) P203 and has lines to which first and second control signals WLEN and WLENB are applied.

The P-type switch (e.g., PFET transistor) P203 is connected between the sub word line SWL and a local word line LWL, and is driven (closed) by the second control signal WLENB when a sub word line enable signal is applied, and passes the sub word line enable signal to a selected local word line LWL as the local word line enable signal.

The N-type switch (e.g., NFET transistor) N209 is also connected between the sub word line SWL and the local word line LWL, and is driven by the first control signal WLEN to complement the local word line enable signal.

The N-type switch (e.g., NFET transistor) N208 is connected between the local word line LWL and a ground voltage (Vss, 0V) line, and is driven by the second control signal WLENB to prevent floating of the non-selected local word line(s) LWL.

The first control signal WLEN is normally maintained at a ground voltage (Vss, 0V) level, and in selecting the local word line LWL, is transited to a first voltage level VPP or to a second voltage level VDD.

The second control signal WLENB complements first control signal WLEN and normally has a first voltage level VPP, and in selecting the local word line LWL, is transited to a ground voltage (Vss, 0V) level.

The operation of the local word line driver circuit 210d shown in FIG. 10 is described as follows.

Before a sub word line enable signal is applied, the local word line LWL is maintained at a ground voltage (Vss, 0V) by an N-type switch (e.g., NFET transistor) N208 operated (closed) by the first control signal WLENB. Then, when the sub word line SWL is selected, the sub word line enable signal is applied through the sub word line SWL. The sub word line enable signal is applied, and simultaneously, the second control signal WLENB is transited to a voltage level to operate (close) the P-type switch (e.g., PFET transistor) P203 so that the sub word line enable signal is transferred to a selected local word line LWL and becomes a local word line enable signal without a voltage drop. Further, the local word line enable signal is complemented by the N-type switch (e.g., NFET transistor) N209 driven by first control signal WLEN.

At this time, in the local word line driver circuit connected to non-selected local word line(s) LWL, the first control signal WLEN and the second control signal WLENB have first voltage level VPP, thus an N-type switch (e.g., NFET transistor) N208 is driven to prevent floating of non-selected local word line LWL. When sub word line SWL is not selected and a sub word line enable signal is not applied, and when the first control signal WLEN has a first voltage level VPP or second voltage level VDD and the second control signal WLENB has a ground voltage (Vss, 0V); floating of the local word line LWL is prevented through the N-type switch (e.g., NFET transistor) N209.

In a semiconductor memory device having the word line driver structure shown in FIG. 5 (e.g., including local word line driver circuit 210a, 210b, 210c, of 210d of FIGS. 7, 8, 9, or 10), the area (on a chip) of word line driver circuit can be reduced, as compared with the area of a conventional word line driver circuit. In other words, assuming that eight cell arrays are disposed in a semiconductor memory device of the prior art, there are needed eight word line driver circuits and thirty-two transistors; but in a structure of word line driver circuit having a three-stage structure according to an exemplary embodiment of the invention, one sub word line driver SWD and eight local word line driver circuits LWD are needed, (with only 19 or 27 transistors). Thus, there is a common advantage (among examples in FIGS. 7, 8, 9, and 10) that the area occupied by a word line driver circuit can be substantially reduced in a semiconductor memory device according to exemplary embodiments of the invention.

The structure of word line driver circuit (see, e.g., FIG. 5) according to exemplary embodiments of the invention can be applied to a FRAM (Ferroelectric Random Access Memory) or to a DRAM (Dynamic Random Access Memory), a PRAM (Phase change Random Access Memory) and an MRAM (Magnetic Random Access Memory), and also to other (e.g., semiconductor) memory devices.

FIG. 11 is a block diagram illustrating the arrangement of combined word line driver and plate line driver circuits SWPD in a FRAM according to another exemplary embodiment of the invention. In FIG. 11, a plate line driver circuit (see e.g., 130 of FIG. 12) is combined in one unit 140 with the sub word line driver circuit SWD (see e.g., 110 of FIG. 12) thus providing the combined word line driver and plate line driver circuit SWPD 140, and having the structure of FIG. 5.

As shown in FIG. 11, in the layout of the word line driver and plate line driver circuits SWPD for use in an FRAM according to an exemplary embodiment, there is a three-stage structure comprised of: a main word line MWL controlled by a word line decoder circuit (not shown); sub word lines SWL and plate lines SPL0 and SPL1 controlled by sub word line driver and plate line driver circuits SWPD; and a local word line LWL controlled by a local word line driver circuit LWD.

The local word line driver circuit LWD may have the same structure as the LWD circuit already described referring to FIGS. 5 through 10 and further description is unnecessary.

The sub word line driver and plate line driver circuits SWPD 140 are respectively connected (in parallel) to the main word line MWL, and provide a plate line enable signal to a plate line SPL that is connected commonly with a plurality of memory cells that are controlled by a plurality of local word line driver circuits 210.

In the sub word line driver and plate line driver circuits SWPD 140, when a main word line enable signal is applied, a plate line enable signal is provided to a plate line SPL0 that is connected with a plurality of memory cells controlled by at least one local word line driver circuit LWD 210 that is connected to a (selected) sub word line SWL0.

Figure 12:
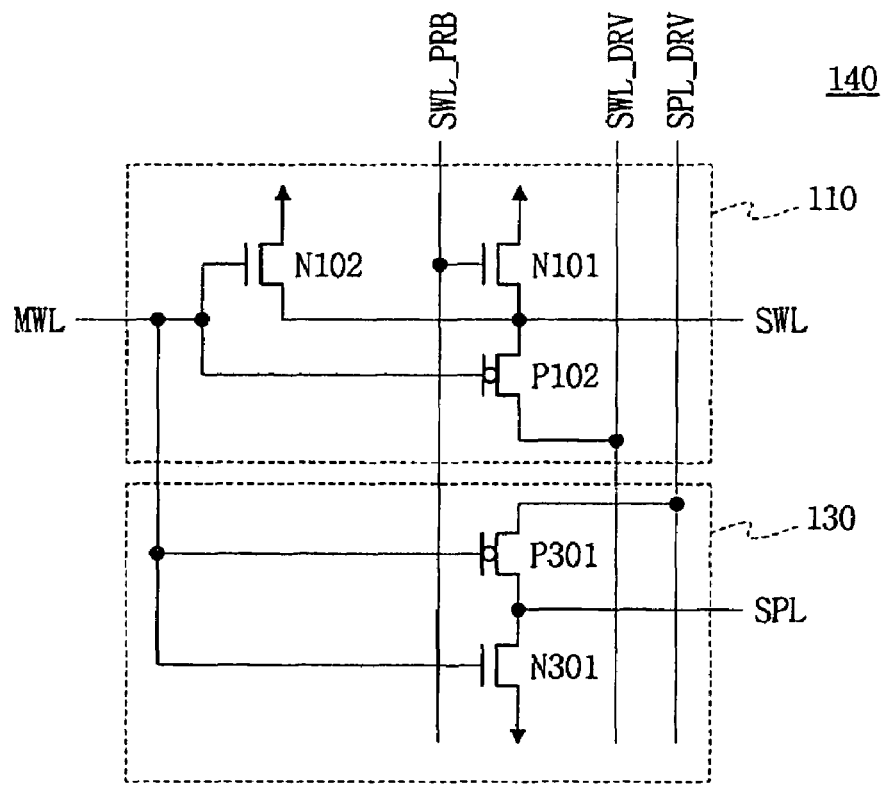
FIG. 12 is a circuit diagram illustrating a word line driver circuit and a plate line driver circuit in the FRAM of FIG. 11.

FIG. 12 is a circuit diagram illustrating an example of the sub word line driver and plate line driver circuit SWPD 140 as shown in FIG. 11.

Referring to FIG. 12, the sub word line driver and plate line driver circuit 140 configured in one unit is constructed of a sub word line driver circuit 110 and a plate line driver circuit 130. The sub word line driver circuit 110 has the same structure as in FIG. 6, thus only a plate line driver circuit 130 will be further described here.

The plate line driver circuit 130 includes one P-type switch (e.g., PFET transistor) P301, one N-type switch (e.g., NFET transistor) N301 and has a line to which a control signal SPL_DRV is applied.

The P-type switch (e.g., PFET transistor) P301 is driven by the main word line enable signal applied through main word line MWL, and is connected between the plate line SPL and the line to which the control signal SPL_DRV is applied. The P-type switch (e.g., PFET transistor) P301 is controlled by the main word line enable signal and transmits the control signal SPL_DRV as a plate line enable signal to the plate line SPL.

The N-type switch (e.g., NFET transistor) N301 is controlled (activated) by a main word line disable signal (MWL), and is connected between the plate line SPL and a ground voltage (Vss, 0V) line, and operates when the main word line signal is not applied, (i.e., when the main word line disable signal is applied), thus preventing floating of the plate line SPL.

The gate of each of the P-type switch (e.g., PFET transistor) P301 and the N-type switch (e.g., NFET transistor) N301 are commonly connected to the main word line MWL in a complementary manner and are connected to each other at a common node (the plate line SPL), and thus form an inverter (e.g., a level shifting inverter), that inverts the signal asserted on line MWL (onto the plate line SPL). Because the P-type switch (e.g., PFET transistor) P301 is connected to the line control line SPL_DRV, rather than directly to the supply voltage VDD, the P301-N301 inverter is active (to invert the MWL line), when the control signal SPL_DRV is supplied as a plate line enable signal at around the power supply voltage level VDD. Thus, the plate line driver circuit 130 consists essentially of two (complementary) switches (FET transistors) configured to form an inverter (e.g., a level shifting inverter) that inverts the signal applied to a word line (e.g., the main word line MWL) when the control signal SPL_DRV is active.

Similarly, the gate of each of the P-type switch (e.g., PFET transistor) P102 and the N-type switch (e.g., NFET transistor) N102 are commonly connected to the main word line MWL in a complementary manner and are connected to each other at a common node (a sub word line SWL), and thus form an inverter (e.g., a level shifting inverter), that inverts the signal asserted on line MWL (onto the sub word line SWL). Because the P-type switch (e.g., PFET transistor) P102 is connected to the control signal SWL_DRV, rather than directly to the supply voltage VDD, the P102-N102 inverter is active (to invert the MWL line), when the control signal SWL_DRV is supplied as a sub word line enable signal at around the power supply voltage level VDD. Thus, the sub word line driver circuit 110 comprises two (complementary) switches (FET transistors) configured to form an inverter (e.g., a level shifting inverter) that inverts the signal applied to a word line (e.g., the main word line MWL) when the control signal SWL_DRV is active.

Figure 1:
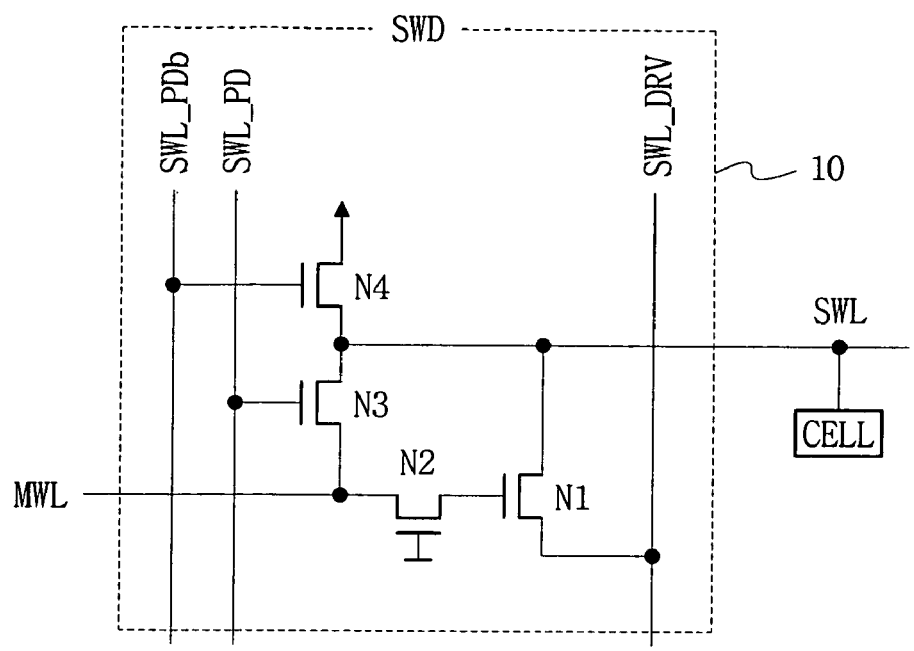
FIG. 1 is a circuit diagram of a conventional word line driver circuit.
Figure 2:
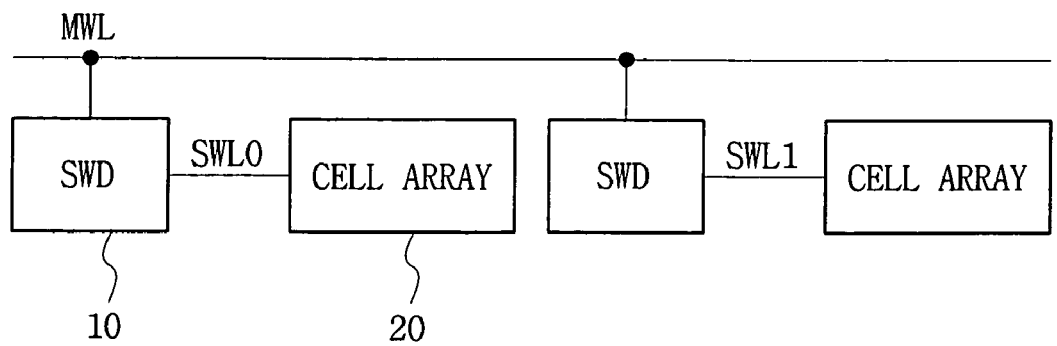
FIG. 2 is a block diagram illustrating the layout of a conventional semiconductor memory device having the word line driver circuit of FIG. 1.
Figure 3:
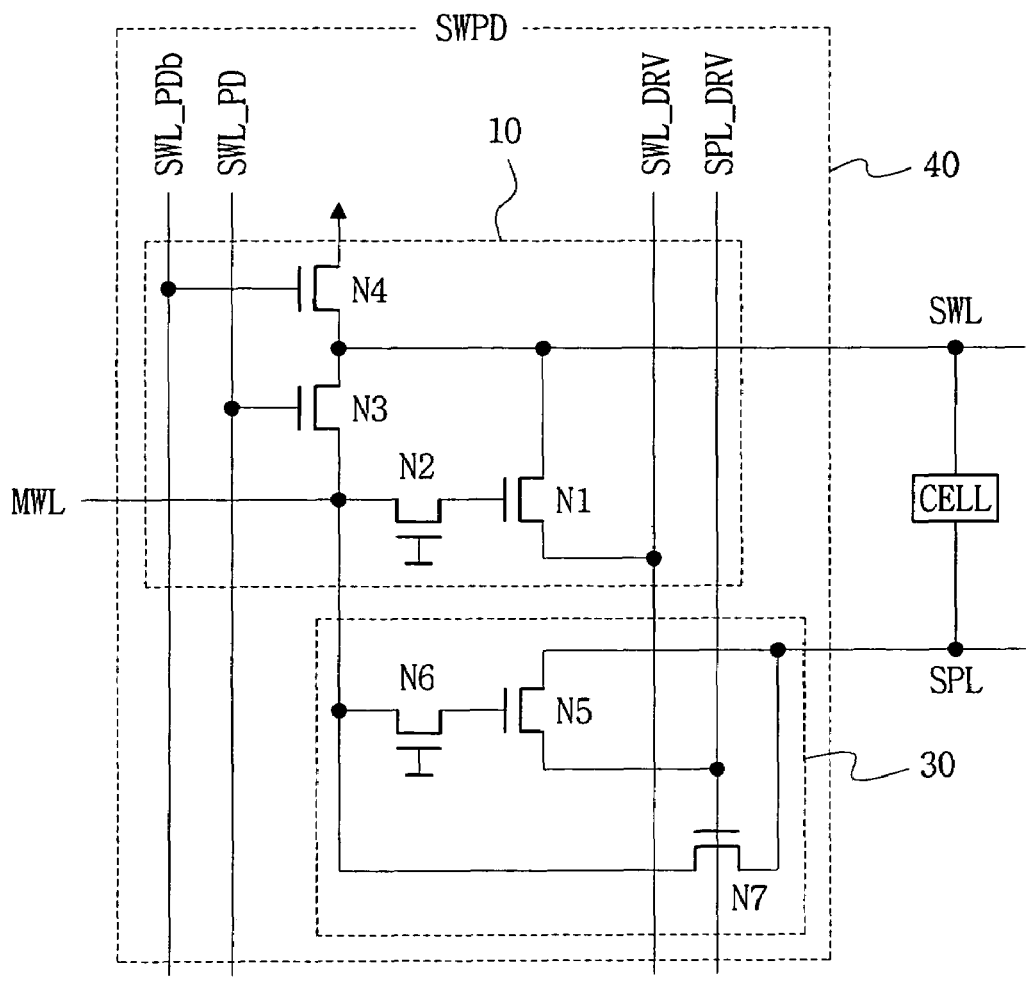
FIG. 3 is a circuit diagram of a conventional word line driver and plate line driver circuit.
Figure 4:
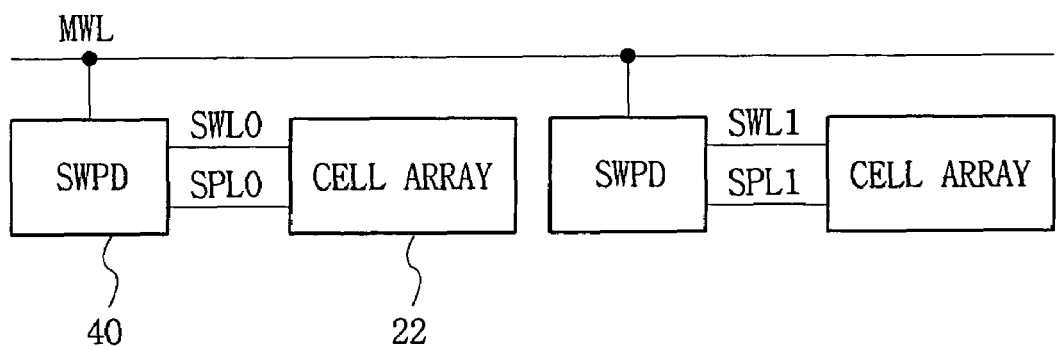
FIG. 4 is a block diagram illustrating the layout of a conventional FRAM memory having word line driver and plate line driver circuits of FIG. 3.

By comparison with one word line driver and plate line driver circuit of a prior art (see e.g., FIG. 3), eight arrays of thirty-two memory cells are configured; even though such a structure is used, one sub word line driver circuit SWD according to an exemplary embodiment of the invention drives eight local word line driver circuits LWD. Each Local word line LWL is connected with thirty-two memory cells, and a is plate line SPL is connected with 256 (32×8) memory cells. One local word line driver circuit LWD of the eight local word line driver circuits LWD is selected and the number of actually operating memory cells is 32. Thus, only 32 memory cells among 256 memory cells connected to the plate line SPL operate (at one time), and the rest 224 memory cells do not operate, thus a loading capacitance problem of the plate line SPL does not occur. In other words, a ferroelectric capacitor of a memory cell that is connected to the plate line SPL but does not operate, has a floating state, and so adds only negligible capacitance to the plate line SPL. Hence, the plate line SPL can operate, almost without an increase in capacitance compared with the prior art.

In an FRAM having a layout of the sub word line driver and plate line driver circuit SWPD 140 and the local word line driver circuit 210 as shown in FIGS. 11 and 12, the area (on a chip) occupied by a word line driver and plate line driver circuit can be reduced, as compared with the conventional word line driver and plate line driver circuit. For example, assuming that eight cell arrays are disposed in the FRAM, eight word line driver circuits and plate line driver circuits are needed and the number of transistors is 56, in the prior art. But, in a layout of the word line driver and plate line driver circuits having a three-stage structure according to an exemplary embodiment of the invention; one sub word line driver and plate line driver circuit SWPD 140, and eight local word line driver circuits LWD 210, are needed, and herewith the number of transistors is only between 21 and 29 (depending on which circuit 210a, 210b, 210c or 210d is chosen to drive the SWL). Accordingly, the area (on a chip) of the word line driver and plate line driver circuit SWPD in the FRAM can be reduced substantially.

As described above, according to an exemplary embodiment of the invention, the layout of word line driver circuit is subdivided into stages: a sub word line driver circuit and a local word line driver circuit, thereby substantially reducing the layout area of semiconductor memory device, as compared with the prior art. Thus the chip size can be substantially reduced, obtaining a semiconductor memory device appropriate to high integration.

While the present invention has been particularly shown and described with reference to exemplary embodiments thereof, it will be understood by those skilled in the art that various changes in form and details may be made therein without departing from the spirit and scope of the present invention as defined by the appended claims. For example, internal configuration of the circuit may be varied or internal elements of the circuit may be replaced with other equivalent or complementary elements. Accordingly, these and other changes and modifications are seen to be within the true spirit and scope of the invention as defined by the appended claims

What is claimed is:

1. A memory device having a circuit for controlling memory cells, the circuit comprising:
    a plurality (m) of sub word line driver circuits that are connected to a main word line and that are adapted to provide a sub word line enable signal to a selected one of m sub word lines in response to a main word line enable signal asserted on the main word line;
    a plurality (m×n) of local word line driver circuits, n of which are connected in parallel to each of the m sub word lines and that are adapted to provide a local word line enable signal to a selected one of m×n local word lines, in response to the sub word line enable signal so as to operate a plurality (l) of memory cells connected to the selected local word line; and
    a plurality (p) of plate line driver circuits, that are respectively connected in parallel, to the main word line, and that are adapted to provide a plate line enable signal to a plate line that is connected to at least n×l memory cells, in response to the main word line enable signal, the n×l memory cells being controlled by n local word line driver circuits connected to t selected sub word line,
    wherein the main word line enable signal, the sub word line enable signal and the local word line enable signal have a first voltage level at a power supply voltage VPP, wherein the first voltage level is higher by a determined amount than a second voltage level VDD, and the main word line enable signal has a ground voltage level.

2. The memory device of claim 1, wherein each memory cell comprises one access switch controlled by an enable signal on the selected local word line, and one ferroelectric capacitor connected between the access switch and a plate line.

3. The memory device of claim 1, wherein the sub word line driver circuit comprises:
    a P-type switch driven by the main word line, configured to provide a sub word line enable signal to a selected sub word line;
    a first N-type switch configured to prevent floating of sub word line when a main word line disable signal is applied; and
    a second N-type switch configured to prevent floating of sub word line not selected when the main word line enable signal is applied.

4. The memory device of claim 1, wherein the sub word line driver circuit comprises:
    a P-type switch driven by the main word line and connected between a first sub word line driving signal line and a sub word line;
    a first N-type switch connected between the sub word line and a ground voltage, and driven by a second control signal line; and
    a second N-type switch driven by the main word line and connected between the sub word line and the ground voltage.

5. A memory device having a circuit for controlling memory cells, the circuit comprising:
    a plurality (m) of sub word line driver circuits that are connected to a main word line and that are adapted to provide a sub word line enable signal to a selected one of m sub word lines in response to a main word line enable signal asserted on the main word line; and
    a plurality (m×n) of local word line driver circuits, n of which are connected in parallel to each of the m sub word lines and that are adapted to provide a local word line enable signal to a selected one of m×n local word lines, in response to the sub word line enable signal so as to operate a plurality (l) of memory cells connected to the selected local word line; and
    a plurality (p) of plate line driver circuits, that are respectively connected, in parallel, to the main word line, and that are adapted to provide a plate line enable signal to a plate line that is connected to at least n×l memory cells, in response to the main word line enable signal, the n×l memory cells being controlled by n local word line driver circuits connected to the selected sub word line.

6. The memory device of claim 5 wherein l memory cells among n×l memory cells connected the plate line can be operated while the other (n-1)l memory cells connected the plate line are not operated.

7. The memory device of claim 5 wherein the number (m) of sub word line driver circuits equals the number (p) of plate line driver circuits.

8. The memory device of claim 5, wherein the plate line driver circuit comprises:
    a P-type switch driven by the main word line and configured to transmit a plate line enable signal to the plate line; and an N-type switch driven by the main word line configured to disable signal to prevent a floating of the plate line.

9. The memory device of claim 5, wherein the plate line driver circuit consists essentially of:
a P-type switch driven by the main word line; and
an N-type switch driven by the main word line,
wherein the a P-type switch and the N-type switch are complementarily connected to the plate line to form an inverter between the main word line and the plate line.

10. The memory device of claim 5, wherein the local word line driver circuit comprises:
an N-type switch that is connected between the sub word line and the local word line to pass the sub word line enable signal as a local word line enable signal to a selected local word line; and
an N-type switch configured to prevent floating of a non-selected local word line.

11. The memory device of claim 5, wherein the local word line driver circuit comprises:
P-type switch connected between the sub word line and the local word line, to provide the sub word line enable signal as the local word line enable signal to a selected local word line;
an N-type switch to prevent floating of non-selected local word line; and
an N-type switch driven by the main word line disable signal, to prevent floating of anon-selected local word line.

12. The memory device of claim 5, wherein the local word line driver circuit comprises:
a P-type switch connected between the sub word line and the local word line to pass the sub word line enable signal as the local word line enable signal to a selected local word line; and
an N-type switch connected between the sub word line and the local word line, to complement the local word line enable signal.

13. The memory device of claim 5, wherein the main word line disable signal, the sub word line enable signal and the local word line enable signal have a first voltage level, and the main word line enable signal has a ground voltage (Vss, 0V), and the plate line enable signal has a second voltage level that is lower than the first voltage level.

14. The memory device of claim 13, wherein the local word line driver circuit comprises:
a third N-type switch driven by a control signal of the second voltage level;
a fourth N-type switch connected between the sub word line and the local word line, to provide a local word line enable signal having the same voltage level as the sub word line enable signal, to a selected local word line, through a boost with the third N-channel transistor; and
a fifth N-type switch to prevent floating of a non-selected local word line.

15. A memory device for controlling an array of memory cells, the device comprising:
a plurality (n) of sub word line driver circuits, each of which is connected to a main word line and is adapted to provide a sub word line enable signal to a sub word line in response to a main word line enable signal provided through the main word line; and
a plurality (n×m) of local word line driver circuits, m of which are connected to each of the n sub word lines, and each of which is adapted to provide a local word line enable signal to a selected local word line in response to the sub word line enable signal so as to operate at least one memory cell connected to the selected local word line,
wherein the main word line enable signal, the sub line enable signal and the local word line enable signal have a first voltage level at a power supply voltage level VPP, wherein the first voltage level is higher by a determined amount than a second voltage level VDD; and the main word line enable signal has a ground voltage level.

16. The device of claim 15, wherein a sub word line driver circuit comprises:
a P-type switch driven by the main word line, to pass a sub word line enable signal to a selected sub word line;
a first N-type switch to prevent floating of the sub word line not selected when a main word line disable signal is applied; and
a second N-type switch driven by the main word line, to prevent floating of the sub word line not selected when the main word line enable signal is applied.

17. The device of claim 15, wherein a local word line driver circuit comprises:
an N-type switch connected between the sub word line and the local word line, to provide the sub word line enable signal as a local word line enable signal to the selected local word line; and
an N-type switch to prevent floating of non-selected local word line.

18. The device of claim 15, wherein a local word line driver circuit comprises:
a third N-type switch driven by a control signal at the second voltage level;
a fourth N-type switch connected between the sub word line and the local word line, to provide a local word line enable signal having the same voltage level as the sub word line enable signal, to a selected local word line, through a voltage boost with the third N-channel transistor; and
a fifth N-type switch to prevent floating of a non-selected local word line.

19. The device of claim 15, wherein a local word line driver circuit comprise:
a P-type switch connected between the sub word line and the local word line, to provide the sub word line enable signal as the local word line enable signal to a selected local word line;
an N-type switch to prevent floating of a non-selected local word line; and
an N-type switch driven by the main word line disable signal, to prevent floating of non-selected local word line.

20. The device of claim 15, wherein a local word line driver circuit comprises:
a P-type switch connected between the sub word line and the local word line, to provide the sub word line enable signal as the local word line enable signal to a selected local word line;
an N-type switch to prevent floating of a non-selected local word line; and
an N-type switch connected between the sub word line and the local word line, to complement the local word line enable signal.

* * * * *